United States Patent [19]

Yeh et al.

[11] Patent Number: 5,569,617
[45] Date of Patent: Oct. 29, 1996

[54] METHOD OF MAKING INTEGRATED SPACER FOR MAGNETORESISTIVE RAM

[75] Inventors: Tangshiun Yeh, St. Paul; Allan T. Hurst, Anoka; Huang-Joung Chen, Eagan; Lonny L. Berg, Elk River; William F. Witcraft, Minneapolis, all of Minn.

[73] Assignee: Honeywell Inc., Minneapolis, Minn.

[21] Appl. No.: 576,279

[22] Filed: Dec. 21, 1995

[51] Int. Cl.⁶ ................................. H01L 21/70
[52] U.S. Cl. ................. 437/48; 437/52; 437/245
[58] Field of Search ................. 437/48, 52, 245, 437/246, 918, 228 S, 228 ME; 365/158, 173

[56] References Cited

U.S. PATENT DOCUMENTS

| 4,731,757 | 3/1988 | Daughton et al. | 365/173 |
| 4,780,848 | 10/1988 | Daughton et al. | 365/173 |
| 5,060,193 | 10/1991 | Daughton et al. | 365/173 |
| 5,064,499 | 11/1991 | Fryer | 437/245 |
| 5,424,236 | 6/1995 | Daughton et al. | 437/52 |

Primary Examiner—Chandra Chaudhari
Attorney, Agent, or Firm—Gregory A. Bruns

[57] ABSTRACT

In a magnetoresistive random access memory device, a spacer material is deposited at the edges of a memory bit to maintain magnetization at the edges in a direction along the edges.

11 Claims, 4 Drawing Sheets

METHOD OF MAKING INTEGRATED SPACER FOR MAGNETORESISTIVE RAM

RELATED APPLICATION

The present application is related to U.S. patent application Ser. No. 08/576,732, entitled "Magnetic Hardening of Bit Edges of Magnetoresistive RAM", by L. Berg, et al, filed on even date herewith and assigned to Honeywell Inc., the assignee of the present application.

BACKGROUND OF THE INVENTION

The present invention relates to ferromagnetic thin film memories and more particularly to a process for the fabrication of a thin film magnetoresistive memory device.

The process for manufacturing the magnetoresistive bit lines involves depositing one or more layers of magnetic material over an underlying layer or surface, and etching the deposited material to a desired configuration.

This process is described in U.S. Pat. No. 5,496,759 which is assigned to Honeywell Inc.

U.S. Pat. No. 4,731,757 dated Mar. 15, 1988, U.S. Pat. No. 4,780,848 dated Oct. 25, 1988, and U.S. Pat. No. 5,060,193 dated Oct. 22, 1991 which are assigned to Honeywell Inc. include background material on magnetoresistive memories and are hereby incorporated by reference.

U.S. Pat. No. 5,496,759, assigned to Honeywell Inc., includes details on the forming of magnetic memory bits and is hereby incorporated by reference. The present invention is an improvement to the process of U.S. Pat. No. 5,496,759.

The process of U.S. Pat. No. 5,496,759 provides first and second layers of thin film ferromagnetic materials separated by a layer of non ferromagnetic material and formed into an elongated shape having tapered ends to provide a magnetic bit. In use, information is kept as a binary bit having one of two alternative logic levels stored in the two layers or films by having the magnetization point in one direction or the other (but opposite in each of these layers to the direction in the other), generally along the easy axis of magnetization. If the direction of magnetization is caused to rotate from such a direction by external magnetic fields, the electrical resistance of the layers will change with this magnetization direction rotation because of the magnetoresistive properties of the films. Measurement of the resistance allows the state of the memory to be determined.

The process described in U.S. Pat. No. 5,496,759 generally provides reliable magnetic bits. However it has been observed that when this process is used for manufacturing magnetic memory bits, that some number of bits will fail after a number of repeated memory storage and retrieval operations, or read/write cycles. The failure mechanism is believed to be bit edge reversal which is sometimes called edge spin reversal. The elongated shape of the bit structure causes large demagnetization fields along the edge of the layers. In such large demagnetization fields, electron spins at the edge of the films are constrained to lie nearly parallel to these edges and the direction of elongation of these films. During read or write operations it is intended that bit edge reversal does not occur. Thus, a need exists for a magnetoresistive memory bit which allows an unlimited number of read/write cycles without bit edge reversal.

SUMMARY OF THE INVENTION

The present invention solves these and other needs by providing a process wherein a layer of a first material is deposited over a magnetoresistive memory bit. The first material is removed except along the edges of the memory bit. The first material acts to maintain or pin the magnetization along the bit edge so that it is in a direction along the bit edge.

DETAILED DESCRIPTION

Figure 1:
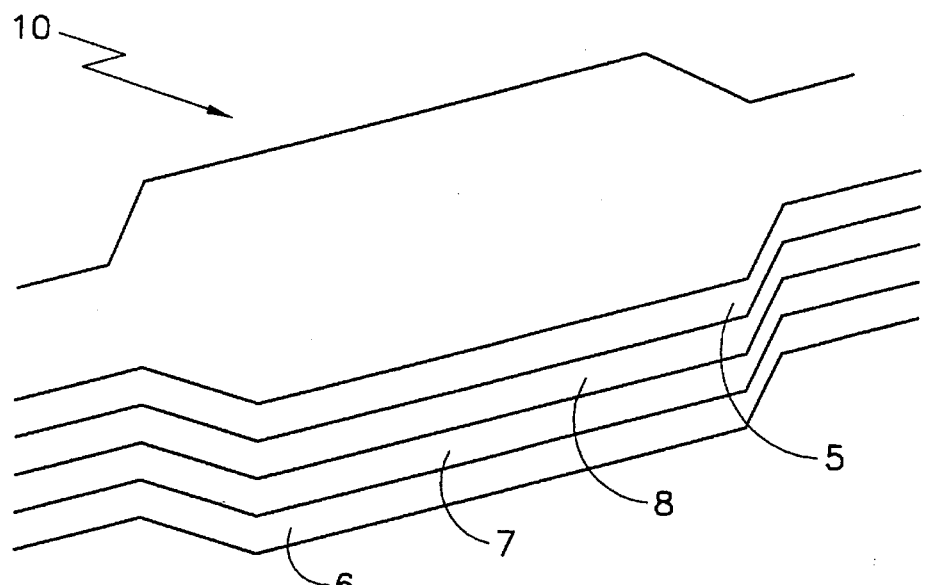
FIG. 1 is an isometric drawing of a portion of a magnetoresistive memory bit according to the prior art.

A portion of a magnetoresistive memory bit 10 is shown in FIG. 1, including first magnetic layer 6, second magnetic layer 8, and intermediate layer 7. Other layers are represented by 5.

Figure 2:
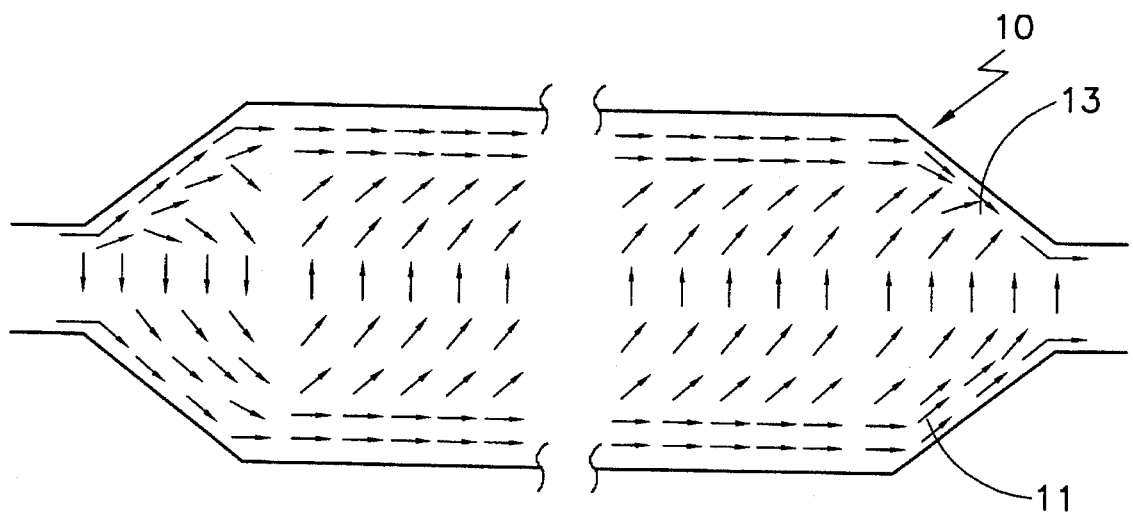
FIG. 2 is a partial planar view of a portion of FIG. 1.

A representation of the magnetizations of a section of one of films, 6 or 8, is shown in FIG. 2. FIG. 2 shows the magnetizations for the storage of a logic value bit of information with the magnetizations at central locations shown pointed upward in that figure and edge magnetizations therein shown pointed primarily to the right. A similar representation (not shown) of the magnetizations for the storage of an alternative logic value bit of information, the magnetizations at central locations would be shown pointed downward, and edge magnetizations would be shown still pointed primarily to the right. Note that the magnetization value gradually increases in the central portion of the film, that is away from the edge portions where the magnetization would remain in the same directions for both memory states. As previously described herein, there is evidence that some number of magnetoresistive bits fail after a number of read/write cycles. A read or write cycle includes the generation of a magnetic field by the bit itself and by a conductive metal strap (not shown) located on top of the bits. In some cases the magnetic field apparently causes the magnetization along a portion of the bit edge to be flipped into another direction. When this occurs, the bit fails and will no longer function. Note that in FIG. 2 in area 11, the magnetization is uniformly upwardly and to the right, whereas in area 13 the magnetization is not uniform, and magnetization at the edge is downward and to the right, while magnetization away from the edge is upward and to the right. There is evidence that a bit structure as shown in FIG. 2 is vulnerable to bit edge reversal in area 13. Once the bit edge reversal occurs at area 13, then after additional read/write cycles the bit edge reversal seems to propagate to the left and the bit fails.

The present invention is an improvement to the process of allowed application Ser. No. 08/365,852, now U.S. Pat. No. 5,496,759 and the process steps of the present invention will be described herein. Reference may be made to allowed application Ser. No. 08/365,852, now U.S. Pat. No. 5,496,759 for a more detailed description of other process steps.

Figure 3:
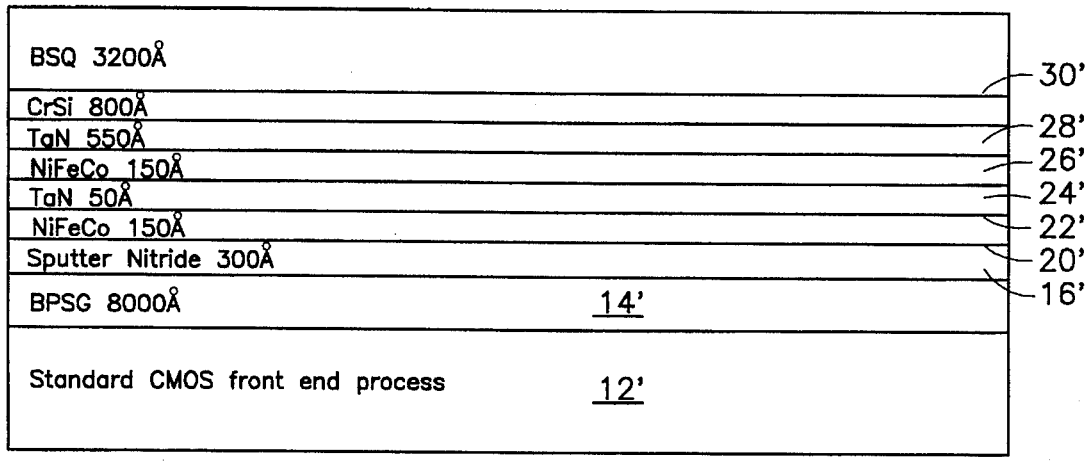
FIGS. 3–8 are cross-sectional views showing certain of the steps of forming a magnetoresistive memory device.

FIG. 3 is representative of a cross section of layers of material that are to be used in forming a magnetoresistive device on silicon wafer 12' having underlying integrated circuits, e.g., CMOS. FIG. 3 shows BPSG layer 14', a sputter nitride layer 16', NiFeCo layer 20', TaN layer 22', NiFeCo layer 24; TaN layer 26', CrSi layer 28' and BSQ layer 30' all as generally described in U.S. Pat. No. 5,496,759. While U.S. Pat. No. 5,496,759 showed longitudinal cross sections of the formation of a memory device, FIGS. 3–7 of the present invention are transverse cross sections.

Figure 4:
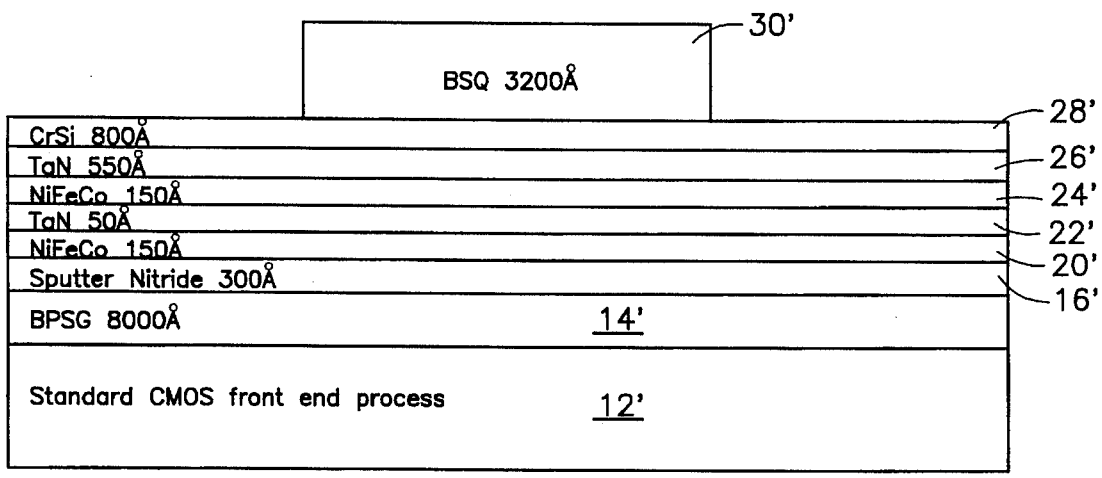
Figure 5:
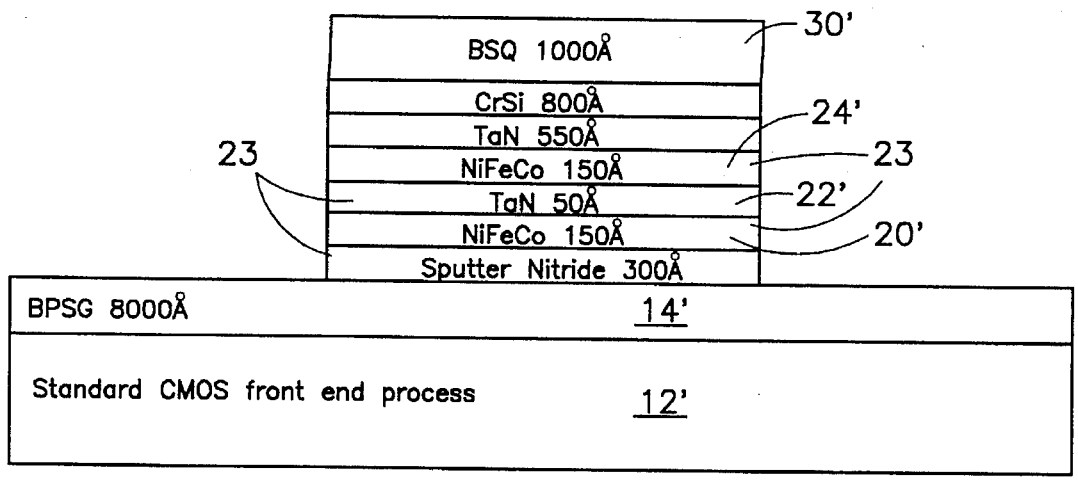

Referring to FIG. 3 wherein a first layer of an amorphous dielectric, e.g., bias sputtered quartz (BSQ) 30' is deposited to a thickness of approximately 3200 angstroms. BSQ layer 30 is then patterned and etched to serve as a masking layer as shown in FIG. 4. The masking layer defines the MRAM bit pattern for ion milling. The wafers are then ion milled, for example, in a Commonwealth ion mill. The ion milling removes the exposed portions of magnetic stack 18 to form a bit pattern and may extend slightly into BPSG layer 14'. In addition, the ion milling removes a portion of BSQ layer 30' which covers bit 32', resulting in BSQ layer 30' having a thickness of about 1000 angstroms.

Figure 6:
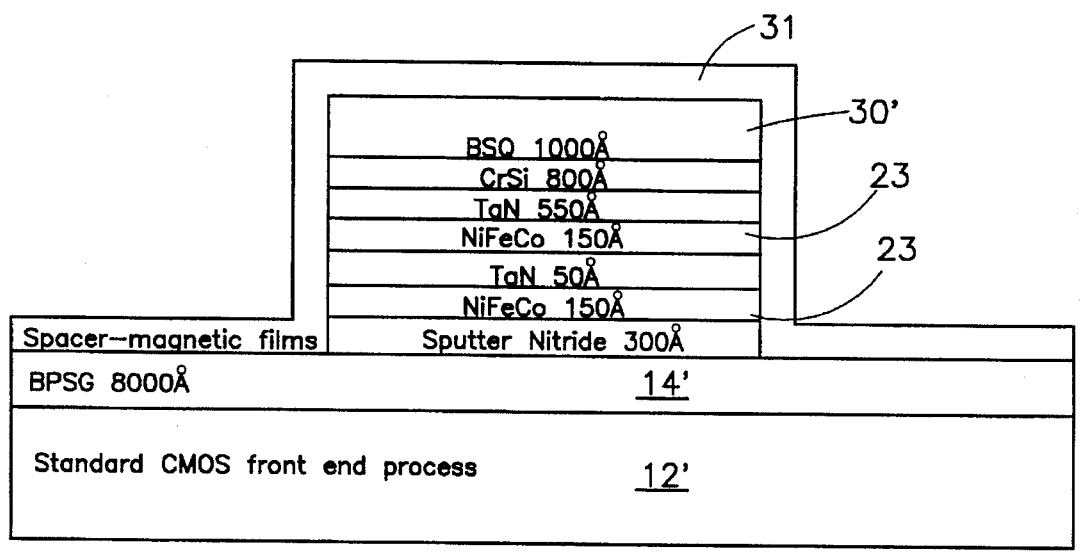

At this time in the process, bit edges 23 are exposed. It is important to be certain that the exposed bit edges are clean and this can be accomplished by a variety of processes. In one successful prototype, an EKC process was used. Other processes such as ion milling or a wet chemical etch could also be used. Once the bit edges are cleaned, a layer of magnetic material 31 is deposited as shown in FIG. 6. Magnetic material layer 31 is preferably a magnetically hard material. Examples include cobalt and cobalt-platinum which may be deposited in a thickness on the order of 300 angstroms. A material similar in composition to magnetic films 20' and 24' may also be used. If a material similar to films 20' and 24' is used, it should be of a thickness comparable but less than the thickness of films 20' or 24'. Using a thicker material of the same type as 20' and 24' can result in the changing of the edge domains of films 20' and 24'. As an alternative, other materials such as anti-ferromagnetic materials may also be used. Examples of these include nickel oxide, cobalt oxide, Iron oxide and nickel-cobalt oxide. Nickel oxide, cobalt oxide, iron oxide and nickel-cobalt oxide are antiferromagnetic materials when the temperature is below their Neel temperature $T_N$. The Neel temperature $T_N$ of both cobalt oxide and iron oxide is lower than room temperature (25° C.), i.e., cobalt oxide and iron oxide are not antiferromagnetic materials at room temperature. The Neel temperature $T_N$ of nickel oxide and nickel-cobalt oxide is higher than room temperature, so they are antiferromagnetic materials at room temperature and are reasonable choices for use in the present invention. Layer 31 is deposited using known normal sputter deposition process methods. It is important that the deposition process provides good step coverage, i.e., good conformality.

Figure 7:
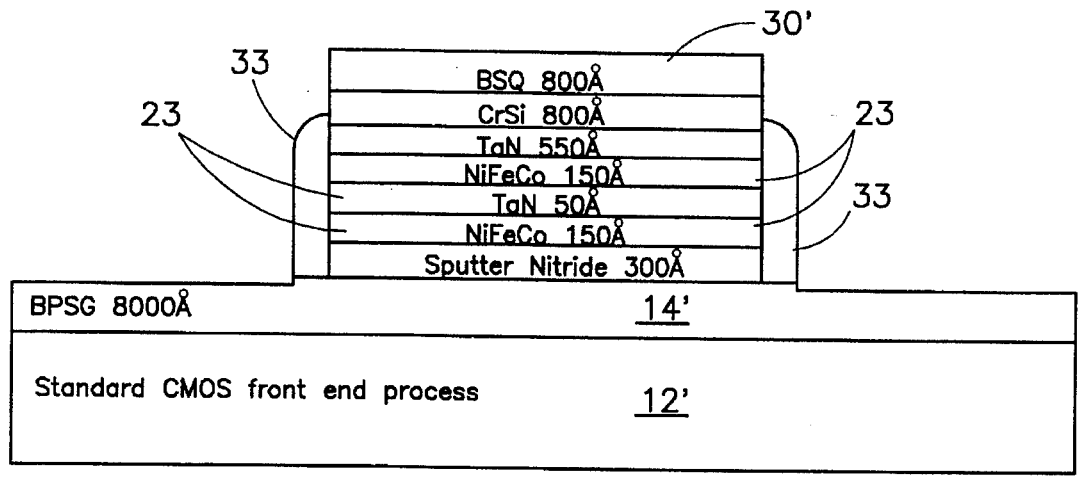
Figure 8:
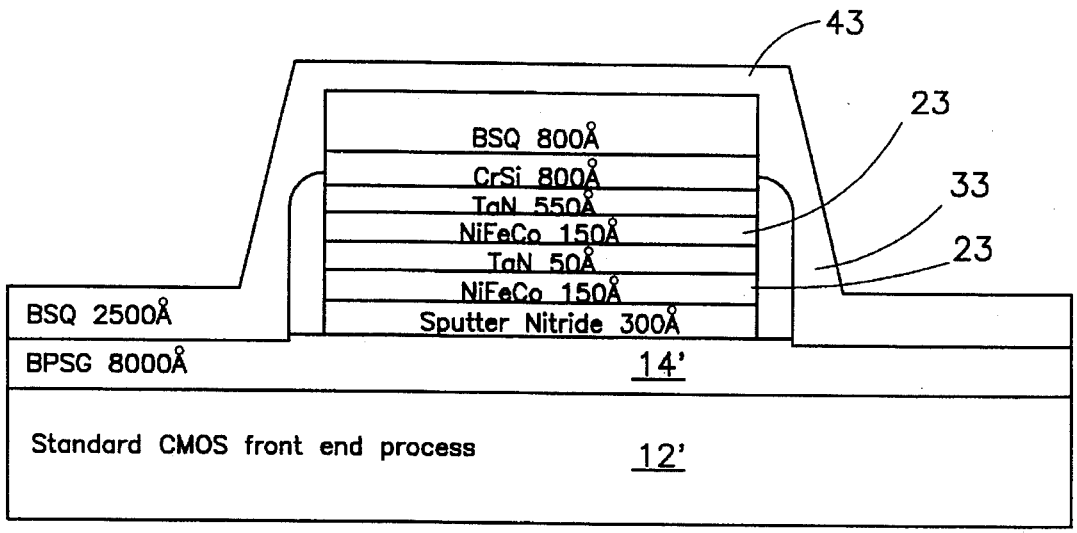

Following conformal deposition of magnetic material layer 31 as shown in FIG. 6, the next step is to perform an ion mill process in the range of approximately 0–15 degrees. This ion mill process will first remove material layer 31 from horizontal surfaces, i.e., from BSQ layer 30' and BPSG layer 14' but will leave magnetic material covering the portion of the bit edge that includes magnetic film layers 20' and 24' as shown in FIG. 7. Some amount of BSQ will also be removed from layer 30' and some amount of BPSG will be removed from BPSG 14'. An in-situ sputter etch process right after the deposition of material 31 is an alternative method to the just described ion mill process.

As shown in FIG. 7, magnetic spacers 33 are now located adjacent edges 23 of magnetoresistive layers 20' and 24'. Magnetic spacers 33 will now provide a magnetic field which will pin magnetization at edges 23 so that it is in a direction along edges 23.

Following the ion mill process that provides the structure illustrated in FIG. 7, the process of U.S. Pat. No. 5,496,759 resumes with the deposition of a layer of BSQ 43 in preparation for bit oxide photo cut and etch.

The process of the present invention may be easily integrated into the process for manufacture of magnetoresistive memory devices.

The scope of the present invention is to be limited by the appended claims and not by the foregoing description.

We claim:

1. A process for forming a magnetoresistive memory device on an insulative layer, comprising the steps of:

forming a stack of a plurality of materials on said insulative layer, said stack including at least a first layer of a magnetic material;

forming a first layer of an amorphous dielectric on said stack;

selectively removing portions of said amorphous dielectric to define a pattern for a magnetic bit:

removing portions of said stack according to said pattern to define a magnetic bit in said first layer of magnetic material, said magnetic bit having a bit edge with magnetization at said bit edge oriented to point in a first direction along said bit edge;

forming a layer of a first material on said magnetic bit;

removing portions of said first material to form a spacer adjacent said bit edge with said spacer maintaining said magnetization at said bit edge in a first direction;

forming a second layer of an amorphous dielectric on said magnetic bit; and performing subsequent processing steps.

2. Process of claim 1 wherein said first material comprises a ferromagnetic material.

3. Process of claim 2 wherein said first material is selected from a group consisting of cobalt, cobalt-platinum and nickel-iron-cobalt.

4. Process of claim 2 wherein said first material is of the same material as said first layer of magnetic material.

5. Process of claim 1 wherein said first material is an anti-ferromagnetic material.

6. Process of claim 5 wherein said first material is nickel-cobalt oxide.

7. Process of claim 5 wherein said first material is nickel oxide.

8. Process of claim 1 wherein said amorphous dielectric is bias sputter quartz.

9. Process of claim 6 wherein said amorphous dielectric is sputter silicon nitride.

10. A process for forming a magnetoresistive memory device on an insulative layer having an underlying integrated circuit, comprising the steps of:

forming a stack of a plurality of materials on said insulative layer, said stack including a first and a second layer of a magnetic material;

forming a first layer of an amorphous dielectric on said stack;

selectively removing portions of said amorphous dielectric to define a pattern for a magnetic bit:

removing portions of said stack according to said pattern to define a magnetic bit in said first layer of magnetic material, said magnetic bit having a bit edge with magnetization in said first and second layer of magnetic material at said bit edge oriented to point in a first direction along said bit edge;

forming a layer of a first material on said magnetic bit;

removing portions of said first material to form a spacer adjacent said bit edge with said spacer maintaining said magnetization at said bit edge in a first direction;

forming a second layer of an amorphous dielectric on said magnetic bit; and performing subsequent processing steps.

11. Process of claim 10 wherein said first material comprises a ferromagnetic material.

* * * * *